(12) United States Patent
Obayashi

(10) Patent No.: US 7,665,787 B2
(45) Date of Patent: Feb. 23, 2010

(54) THIN PLATE SUPPORTING CONTAINER CLAMPING DEVICE

(75) Inventor: Tadahiro Obayashi, Kikuchi (JP)

(73) Assignee: Miraial Co., Ltd. (JP)

( * ) Notice: Subject to any disclaimer, the term of this patent is extended or adjusted under 35 U.S.C. 154(b) by 620 days.

(21) Appl. No.: 11/245,159

(22) Filed: Oct. 7, 2005

(65) Prior Publication Data

US 2006/0081498 A1 Apr. 20, 2006

(30) Foreign Application Priority Data

Oct. 14, 2004 (JP) .............................. 2004-300578

(51) Int. Cl.
*B66C 1/42* (2006.01)
(52) U.S. Cl. ................................. 294/103.1
(58) Field of Classification Search ................. 206/710, 206/711; 414/411, 222.01; 294/103.1, 88
See application file for complete search history.

(56) References Cited

U.S. PATENT DOCUMENTS

| | | | | |
|---|---|---|---|---|
| 4,995,430 | A * | 2/1991 | Bonora et al. ................. | 141/98 |
| 5,451,131 | A * | 9/1995 | Hecht et al. ............... | 414/217.1 |
| 5,611,452 | A * | 3/1997 | Bonora et al. ............... | 220/378 |
| 6,501,070 | B1 * | 12/2002 | Bacchi et al. ............... | 250/239 |
| 6,595,075 | B1 * | 7/2003 | Shien et al. ................ | 73/865.9 |
| 7,433,050 | B2 * | 10/2008 | Sakamoto ..................... | 356/500 |
| 7,621,714 | B2 * | 11/2009 | Miyajima et al. ............ | 414/810 |
| 2002/0051701 | A1 | 5/2002 | Saeki et al. | |
| 2003/0029479 | A1 * | 2/2003 | Asano .......................... | 134/18 |
| 2003/0111912 | A1 * | 6/2003 | Binnard et al. ................ | 310/12 |
| 2003/0142281 | A1 * | 7/2003 | Nishi ........................... | 355/53 |
| 2003/0169412 | A1 * | 9/2003 | Hazelton ...................... | 355/72 |
| 2005/0095098 | A1 | 5/2005 | Miyajima et al. | |

FOREIGN PATENT DOCUMENTS

JP 2003-297903 10/2003

* cited by examiner

*Primary Examiner*—J. Gregory Pickett
*Assistant Examiner*—Jenine M Pagan
(74) *Attorney, Agent, or Firm*—Bacon & Thomas, PLLC

(57) ABSTRACT

The invention provides a thin plate supporting container clamping device for fixing a thin plate supporting container when the thin plate supporting container in which semiconductor wafers are stored therein for transportation is placed on a loading port at a destination thereof for unloading and loading the semiconductor wafers automatically, including a hook member to be engaged with a retaining member of the thin plate supporting container; a drive unit for supporting the retracted thin plate supporting container in a state in which the hook member is supported so as to be capable of moving in the vertical direction and the hook member is engaged with the retaining member; and a control unit for adjusting a force to retract the hook member. The control unit adjusts the force to retract the hook member on the basis of detection values of a thickness sensor, a position sensor, and a retracting force detection sensor.

8 Claims, 5 Drawing Sheets

THIN PLATE SUPPORTING CONTAINER CLAMPING DEVICE

CROSS-REFERENCE TO RELATED APPLICATION

This application claims, under 35 USC 119, priority of Japanese Application No. 2004-300578 filed Oct. 14, 2004.

BACKGROUND OF THE INVENTION

1. Field of the Invention

The present invention relates to a thin plate supporting container clamping device on which a thin plate supporting container is placed for automatically unloading thin plates such as semiconductor wafers, memory disks, or liquid crystal glass substrates stored in the thin plate supporting container at a destination.

2. Description of the Related Art

The thin plate supporting container clamping device is a device for fixing the thin plate supporting container to a loading port. In other words, the thin plate supporting container clamping device is a device for fixing the thin plate supporting container that is transported to a clean room with a plurality of semiconductor wafers or the like stored therein to the loading port for automatic unloading or loading thereof.

The thin plate supporting container clamping device includes a hook member provided on an upper surface of the loading port so as to move in the vertical direction, and supports the thin plate supporting container on the upper surface of the loading port by engaging and retracting the hook member with a retaining portion of the thin plate supporting container.

A force of the hook member to engage and retract with the retaining portion of the thin plate supporting container is set to such a magnitude that a container body is not displaced when a lid member of the thin plate supporting container is automatically removed.

However, with the thin plate supporting container clamping device in the known art as described above, since the hook member is pulling the thin plate supporting container with the force of such a magnitude that the container body is not displaced when the lid member is automatically removed, the pulling force may be too strong for the container body after having removed the lid member. When the pulling force is too strong, the container body may be deformed, and hence the semiconductor wafers stored therein may deviate from height alignment. When the semiconductor wafers deviate from height alignment, there may arise a problem such that a portion of a fork of a device for unloading and loading the semiconductor wafers comes into contact with the semiconductor wafers, whereby the semiconductor wafers may be scratched or cracked.

SUMMARY OF THE INVENTION

In view of such circumstances, it is an object of the present invention to provide a thin plate supporting container clamping device in which a thin plate supporting container placed on a loading port is supported with an adequate force for maintaining the heights of thin plates stored therein.

In order to solve the above-described problem, the invention provides a thin plate supporting container clamping device for fixing a thin plate supporting container when the thin plate supporting container in which thin plates are stored therein for transportation is placed on a loading port at a destination thereof for unloading and loading the thin plates automatically, including a hook member for engaging a retaining portion of the thin plate supporting container and supporting the entire thin plate supporting container, a drive unit which supports the hook member so as to be movable in the vertical direction and supports the thin plate supporting container by retracting the hook member in a state of engaging the retaining portion of the thin plate supporting container, and a control unit for controlling a force of the drive unit to retract the hook member so as to be strong when mounting and dismounting a lid member of the thin plate supporting container and to be weak when unloading and loading the thin plates.

In this arrangement, by the control unit for controlling the force to retract the hook member by the drive unit so as to be strong when dismounting the lid member of the thin plate supporting container and to be weak when unloading and loading the thin plate thereafter, displacement of a container body when dismounting the lid member from the container body is reliably prevented, and deformation of the container body after having removed the lid member is also prevented. Consequently, height misalignment of the thin plates stored therein is prevented, whereby a fork portion of a thin plate unloading and loading device is prevented from coming into contact with the thin plates and scratching or damaging the same when unloading and loading the thin plates automatically.

DESCRIPTION OF THE PREFERRED EMBODIMENTS

Figure 1:
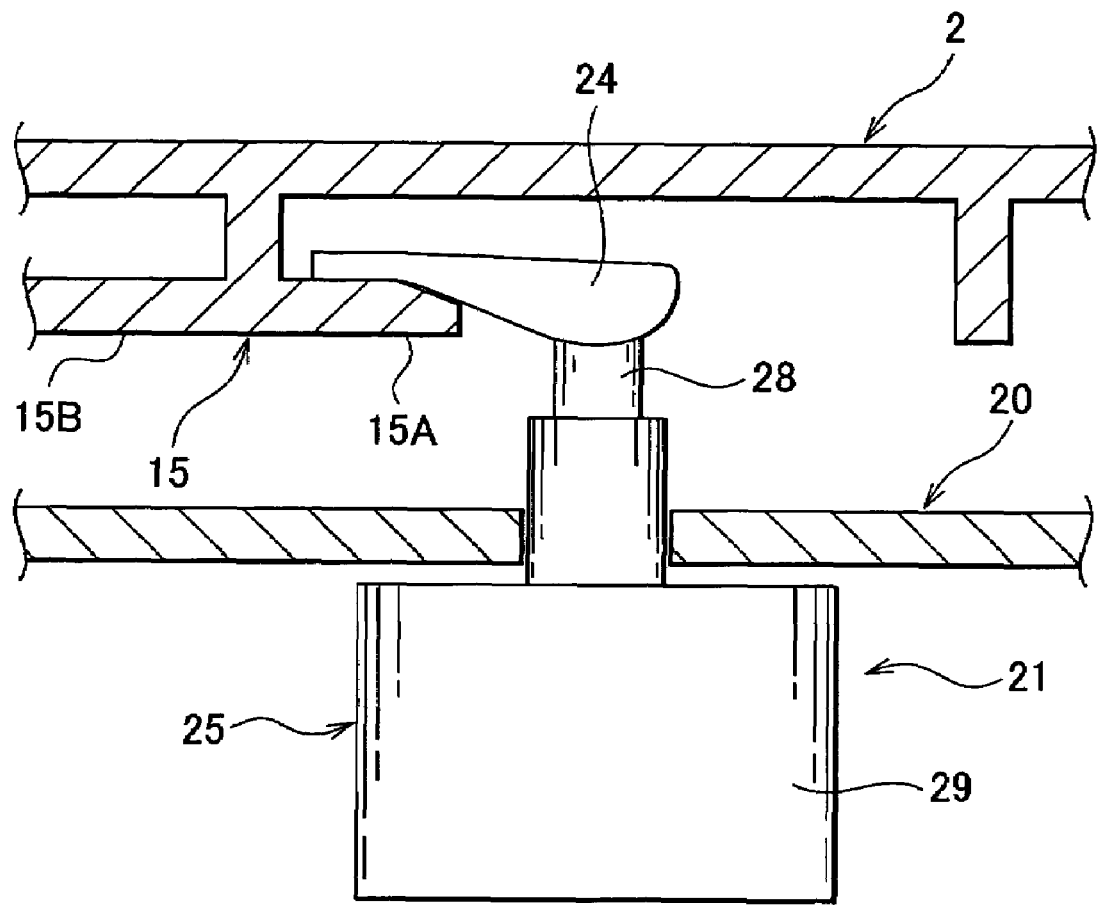
FIG. 1 is a cross-sectional view showing a principal portion of a thin plate supporting container clamping device according to an embodiment of the invention.

Referring now to the attached drawings, an embodiment of the invention will be described. A thin plate supporting container clamping device according to this embodiment is a device for supporting a thin plate supporting container. More specifically, the thin plate supporting container clamping device is a device for fixing and supporting the thin plate supporting container including thin plates such as semiconductor wafers, storage disks, or liquid crystal glass substrates stored therein and being transported for mounting and dismounting of a lid member and for automatic unloading and loading of the semiconductor wafers or the like stored therein.

In this specification, the thin plates supporting container for storing the semiconductor wafers will be described as an example.

The thin plate supporting container will first be described. There are various types of thin plate containers that can be applied with the thin plate supporting container clamping device of this embodiment. An example is shown in FIGS. 2 to 5. A thin plate supporting container 1 shown in the drawing includes a container body 2 for storing a plurality of semiconductor wafers (not shown) therein, two groove plates (not shown) provided on opposing side walls in the container body 2 for supporting the semiconductor wafers stored therein from both sides, a lid member 4 for closing an opening of the container body 2, a top flange 5 to be held by an arm member of a transporting device (not shown), and a carrier handle 6 used by an operator when he/she grips with his/her hand for carrying the thin plate supporting container 1. The top flange 5 and the carrier handle 6 are mounted and dismounted as needed. There is also the thin plate supporting container 1 which is not provided with the top flange 5 and the carrier handle 6. In either case, the invention according to this embodiment can be applied.

The container body 2 is formed substantially into a cubic shape as a whole. The container body 2 includes four side wall portions 2A, 2B, 2C, 2D and a bottom plate portion 2E in a state of being placed vertically (in a state of being placed with the bottom plate portion 2E at the bottom), and the opening is provided on top. The respective side wall portions 2A, 2B, 2C and 2D are provided with reinforcing ribs 9. When the container body 2 is installed in a manufacturing line of the semiconductor wafers so as to oppose a wafer transporting robot (not shown) which is a device for unloading and loading the semiconductor wafers, it is turned over sideways (a state shown in FIG. 2) on a loading port 20 in a semiconductor manufacturing process line, described later, (see FIG. 6) with accuracy. On an outside surface of the side wall portion 2A which comes to the bottom in the state of being turned over sideways, a positioning device 11 of the thin plate supporting container 1 is provided. On the outside of the side wall portion 2B which comes to the top in the state of being turned over sideways, the top flange 5 is detachably mounted. On the outsides of the side wall portions 2C, 2D which correspond to lateral wall portions in the state of being turned over sideways, the handle 6 for transportation is detachably attached.

The positioning device 11 includes three fitting grooves 13 in the shape of a V-shape groove. Each fitting groove 13 includes a first fitting groove 13A which aligns in the vertical direction of the container body 2, and second and third fitting grooves 13B, 13C inclined by the same angle (approx. 60 degrees) with respect to the vertical direction of the container body 2. The three fitting grooves 13 are set to a size which conforms to a standard with high degree of accuracy. The thin plate supporting container 1 is placed at an accurate position with the respective fitting grooves 13A, 13B, 13C of the positioning device 11 fitted with three fitting projections 22 on the loading port 20, whereby the semiconductor wafers are unloaded and loaded by the wafer transporting robot.

Figure 3:
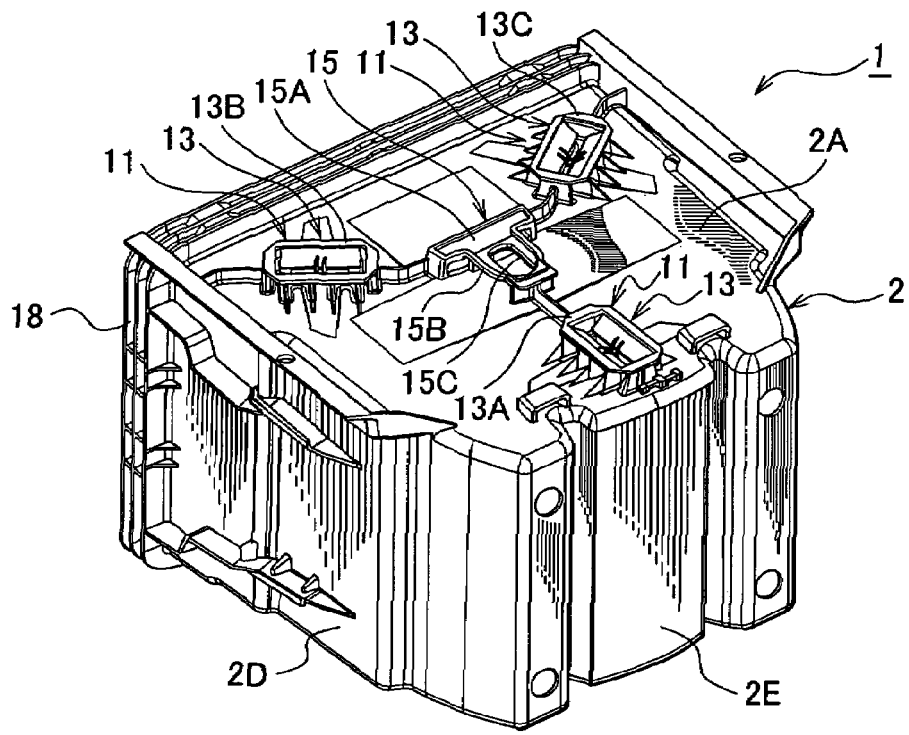
FIG. 3 is a perspective view showing the thin plate supporting container according to the embodiment of the invention.
Figure 5:
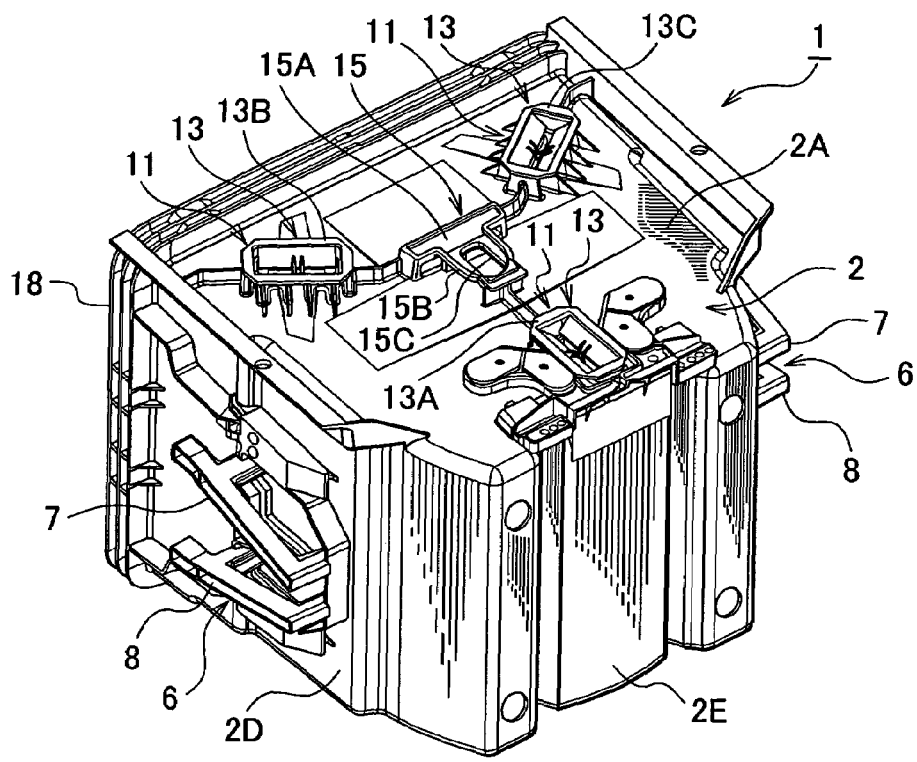
FIG. 5 is a perspective view showing the thin plate supporting container according to the embodiment of the invention.

At the center of the side wall portion 2A (at the center position of the three fitting grooves 13), a retaining member 15 serving as a retaining portion is engaged with a hook member 24 of a thin plate supporting container clamping device 21, described later. The retaining member 15 includes a front retaining strip 15A and a rear retaining strip 15B as shown in FIGS. 1, 3, and 5. The front retaining strip 15A is a portion to which the hook member 24 fits from the front (from the side of the lid member 4), and includes a horizontal plate overhanging toward the front. The hook member 24 fits into the front retaining strip 15A, whereby the container body 2 is fixed. The rear retaining strip 15B is a member to which a T-shaped hook member (not shown) is fitted for fixing the container body 2 to the loading port 20. The rear retaining strip 15B includes an elongated hole 15C, so that the hook member is fitted into the elongated hole 15C for fixing the container body 2.

Figure 4:
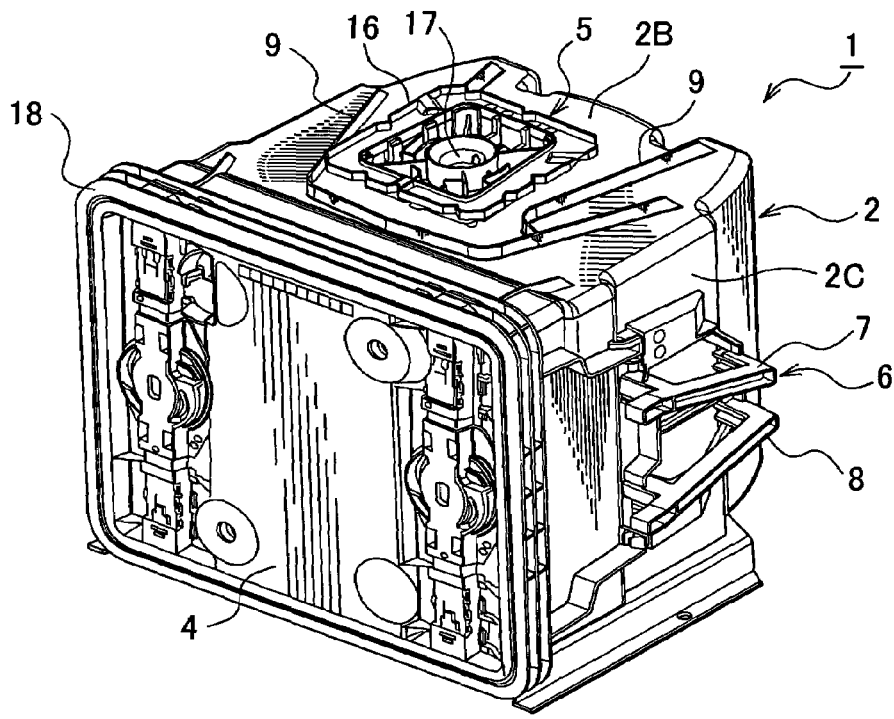
FIG. 4 is a perspective view showing the thin plate supporting container according to the embodiment of the invention.

As shown in FIG. 4, the top flange 5 includes a flange member 16 and a body member 17. The flange member 16 is a member to be gripped by the arm member (not shown) of the transporting device. In a plant or the like, the top flange 5 is gripped by the arm member of the transporting device, whereby the thin plate supporting container 1 is transported. The body member 17 is a member for detachably attaching the flange member 16 to the container body 2.

As shown in FIGS. 4 and 5, the handle 6 includes two gripping bars 7, 8. The respective gripping bars 7, 8 are arranged at different angles from each other. Accordingly, the operator can select a suitable one of the two gripping bars 7, 8 depending on whether he/she holds the thin plate supporting containers 1 vertically or horizontally. The angles of the gripping bars 7, 8 are set to an angle optimal for holding the thin plate supporting container 1 in the vertical direction and to an angle optimal for holding the same in the lateral direction, respectively. The specific angles are to be set according to various conditions such as the size or the weight of the thin plate supporting container 1. The handle 6 is detachably mounted to each of the side wall portions 2C, 2D.

Figure 2:
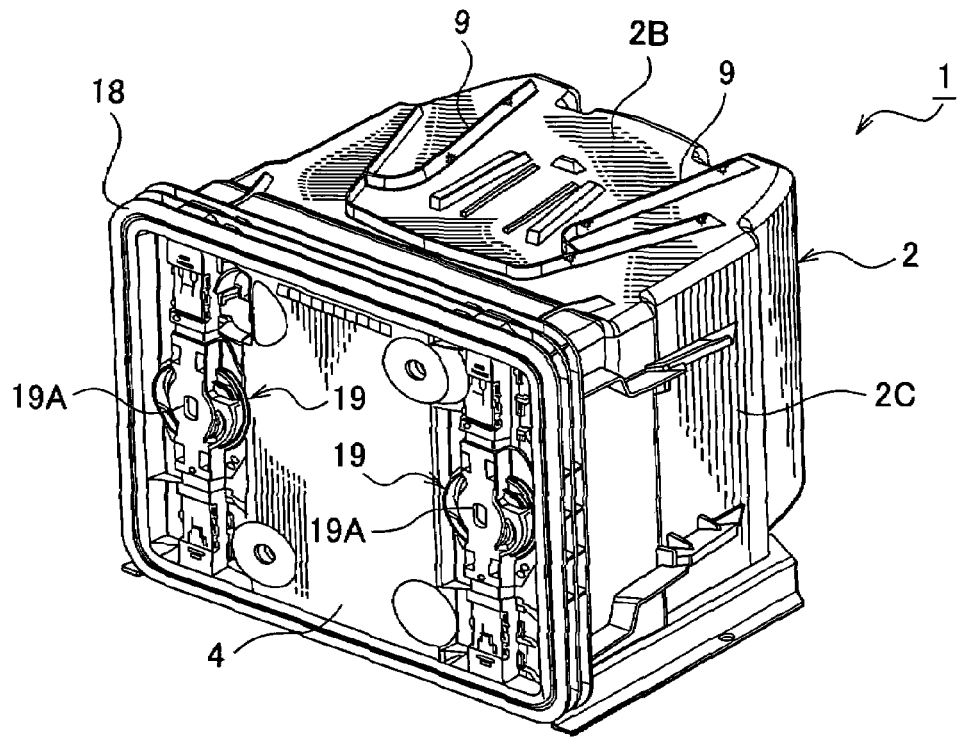
FIG. 2 is a perspective view showing a thin plate supporting container according to the embodiment of the invention.

The container body 2 is provided with a lid member receiving shoulder 18 to which the lid member 4 fits at the upper end thereof. The lid member receiving shoulder 18 is formed by extending the upper end of the container body 2 to a size of the lid member 4. Provided between the lid member receiving shoulder 18 and the lid member 4 which is fitted thereto is a fixing device for fixing the lid member 4 in a state in which the lid member 4 is fitted to the lid member receiving shoulder 18. While there are various types of fixing devices, the fixing member in FIGS. 2 and 3 is configured of a simple attachment/detachment mechanism 19 integrated in the lid member 4. The simple attachment/detachment mechanism 19 includes projectable and retractable engaging claws (not shown) on both sides (upper and lower sides in FIG. 2) of the lid member 4. In this simple attachment/detachment mechanism 19, by rotating the T-shaped hook (not shown) of a lid member attachment/detachment device (not shown) inserted from a hook insertion port 19A at the center, the engaging claws are projected or retracted so that the lid member 4 is fixed and released. There are also other types of fixing devices such that lid member fixing hooks are provided on both left and right sides of the container body 2. The lid member attachment/detachment device (not shown) corresponding to the fixing device is provided at a position adjacent to the loading port 20 (see FIG. 6), and performs attachment and detachment of the lid member 4 of the thin plate supporting container 1 automatically with respect to the container body 2 in a state in which the thin plate supporting container 1 is placed on the loading port 20 and fixed by the thin plate supporting container clamping device 21 (see FIG. 1).

Figure 6:
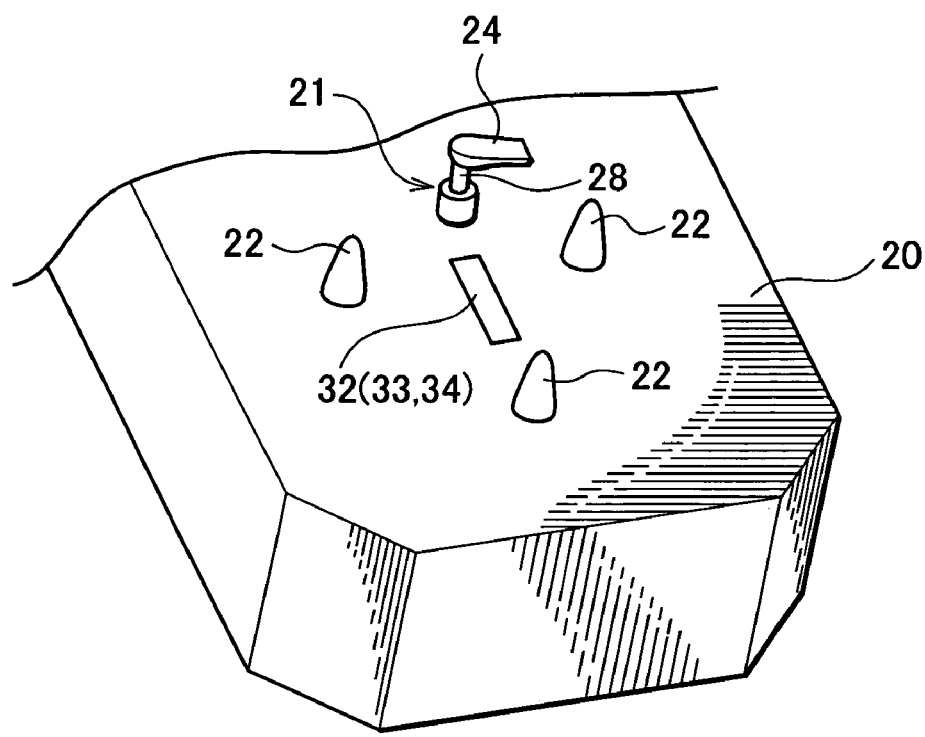
FIG. 6 is a perspective view showing a loading port for placing the thin plate supporting container according to the embodiment of the invention.

The loading port 20 is a portion where the thin plate supporting container 1 is placed for loading and unloading of the semiconductor wafers, and is provided at a carry-in entrance of the thin plate supporting container 1 in a clean room. As shown in FIG. 6, the fitting projections 22 for positioning and supporting the thin plate supporting container 1 is provided on the upper surface of the loading port 20. The fitting projections 22 are provided at positions corresponding to the three fitting grooves 13 of the thin plate supporting container 1, respectively. Accordingly, by the fitting projections 22 being fitted into the fitting grooves 13 respectively, the thin plate supporting container 1 can be positioned and supported automatically at an accurate position on the upper surface of the loading port 20.

The thin plate supporting container clamping device 21 is a device for fixing the tin plate supporting container 1 on the upper surface of the loading port 20. In other words, the thin plate supporting container clamping device 21 is a device for fixing and supporting the thin plate supporting container 1 on the side of the loading port 20 in a state in which the thin plate supporting container 1 is placed on the loading port 20 and is accurately positioned by the positioning device 11 for unloading and loading automatically the semiconductor wafers stored in the thin plate supporting container 1 automatically at a destination.

Figure 7:
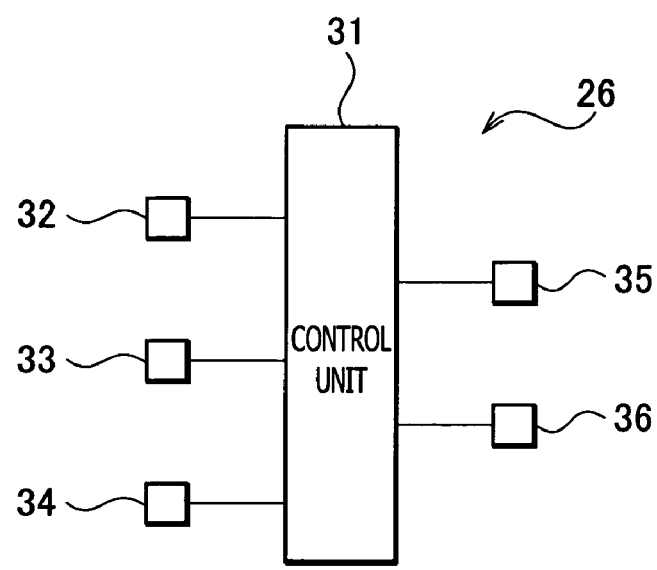
FIG. 7 is a block diagram showing a control system of the thin plate supporting container clamping device according to the embodiment of the invention.

The thin plate supporting container clamping device 21 mainly includes the hook member 24, a drive unit 25, and a control system 26 as shown in FIGS. 1, 6, and 7.

The hook member 24 is a member for engaging the front retaining strip 15A of the retaining member 15 of the thin plate supporting container 1 for supporting the entire thin plate supporting container 1. The hook member 24 is formed into a horizontal plate shape, and is adapted to be engaged with the front retaining strip 15A by being brought into contact with the upper surface of the front retaining strip 15A.

The drive unit 25 is a device for retracting the hook member 24 engaged with the thin plate supporting container 1 downward. The drive unit 25 has a function to move the hook member 24 in the vertical direction and to rotate the same. Accordingly, the drive unit 25 supports the thin plate supporting container 1 by retracting the hook member 24 downward in a state of being engaged with the front retaining strip 15A of the retaining member 15, and rotates the hook member 24 to switch between an engaging state and a stand-by state with respect to the front retaining strip 15A as needed. The drive unit 25 includes a supporting shaft 28 connected integrally with the hook member 24 for supporting the hook member 24, and a supporting shaft driving mechanism 29 for moving the supporting shaft 28 in the vertical direction and rotating the same.

The supporting shaft 28 is provided so as to project from the upper surface of the loading port 20. The supporting shaft 28 is provided at a position opposing to the front retaining strip 15A of the retaining member 15 of the thin plate supporting container 1 placed on the accurate position on the loading port 20.

The supporting shaft driving mechanism 29 includes an elevating mechanism (not shown) for moving the supporting shaft 28 in the vertical direction and a rotating mechanism (not shown) for rotating the supporting shaft 28. The elevating mechanism can use any device as long as it has a function to move the supporting shaft 28 in the vertical direction. More specifically, the elevating mechanism may be composed of an electromagnetic solenoid or a linear motor which moves the supporting shaft 28 directly in the vertical direction, or a servo motor or the like which is connected via a gear. These devices move the supporting shaft 28 in the vertical direction, and adjust the force to retract the supporting shaft 28 downward by controlling the frequency or the like. This adjustment is carried out by a control unit 31. The rotating mechanism rotates the hook member 24 when bringing the hook member 24 into the engaging state or the stand-by state with respect to the front retaining strip 15A of the retaining member 15. The rotating mechanism includes a servo motor or the like connected via a gear.

The control system 26 is a device for controlling the drive unit 25. More specifically, the control system 26 controls the force of drive unit 25 to retract the hook member 24 so as to be strong when mounting and dismounting the lid member 4 of the thin plate supporting container 1, and to be weak when unloading and loading the thin plate thereafter.

The control system 26 mainly includes the control unit 31, a thickness sensor 32, a position sensor 33, a retracting force detection sensor 34, a rotation drive unit 35 and a vertical movement drive unit 36 as shown in FIG. 7.

The thickness sensor 32 is a thickness measuring device for measuring the thickness of the side wall portion 2A, which is a side wall of the thin plate supporting container 1 having the retaining member 15 provided thereon. Since thickness of the wall surface of the thin plate supporting container 1 is different depending on the type, strength of the side wall portion 2A is also different depending on the type of the thin plate supporting container 1. Therefore, when the hook member 24 is retracted at a constant force irrespective of the type of the thin plate supporting container 1, an amount of deformation of the entire thin plate supporting container 1 also varies according to the strength of the side wall portion 2A. When the amount of deformation of the entire thin plate supporting container 1 is large, the loaded heights of the semiconductor wafers stored therein are slightly varied, and hence the fork portion of the wafer transporting robot may come into contact therewith. Therefore, the hook member 24 is retracted with a force corresponding to the strength of the side wall portion 2A so as to prevent misalignment of the semiconductor wafers in loaded height due to the deformation of the thin plate supporting container 1 during loading and unloading of the semiconductor wafers. In other words, the strength of the side wall portion 2A is calculated by measuring the thickness of the side wall portion 2A, and the hook member 24 is retracted downward with a retracting force which corresponds to the strength of the side wall portion 2A. In other words, the force of retracting the hook member 24 is adjusted to be strong when removing the lid member 4 of the thin plate supporting container 1, and to be weak when unloading and loading the semiconductor wafers thereafter. Since the lid member attachment/detachment device may press the lid member 4 strongly when removing the lid member 4, it is necessary to pull and fix the thin plate supporting container 1 by a force which is strong to some extent. Since contact between the fork portion of the wafer transporting robot and the semiconductor wafers cannot happen, even when the thin plate supporting container 1 is deformed by being pulled by the strong force, it causes no problem. Therefore, the thin plate supporting container 1 is fixed with the force which is strong to some extent. However, when unloading and loading the semiconductor wafers, deformation which causes misalignment of the semiconductor wafers in height is not allowed, and hence the force is weakened to an extent which does not cause the misalignment of the semiconductor wafer in height. In other words, the force is weakened to be included within a limit which causes no misalignment of the semiconductor wafers in height even when the thin plate supporting container 1 is deformed to some extent. This control is carried out by the control unit 31.

The thickness sensor 32 may be various types of sensors. In this case, a sensor utilizing reflected light will be shown as an example. The side wall portion 2A, being formed of transparent synthetic resin, transmits and reflects light. Therefore, the thickness can be measured with a laser beam. More specifically, when the laser beam is irradiated from a light-emitting element obliquely at a preset angle, the laser beam is reflected on a lower surface and an upper surface of the side wall surface 2A respectively and two laser beams are generated. The track drawn by the laser beam assumes two isosceles triangles having apexes thereof on the lower surface and the upper surface of the side wall surface 2A respectively. When these two reflected light beams are detected by a light-receiving element composed of one-dimensional array elements, the lengths of the bottom sides of these isosceles triangles are known. Since an outgoing angle and an incident angle on both sides thereof are known in advance, the difference of the height of the respective isosceles triangles are calculated based on these angle values, which corresponds to the thickness of the side wall portion 2A. Since light is refracted in the side wall portion 2A, the thickness of the side wall portion 2A can be detected further accurately if the index of refraction of the material of the side wall portion 2A is taken into consideration. It is also possible to calculate the thickness of the side wall portion 2A by detecting the phase difference between the two reflected light beams. This arithmetic processing is executed by the control unit 31.

The position sensor 33 is a position measuring device for measuring the positions of the semiconductor wafers stored in the thin plate supporting container 1. The position sensor 33 observes the misalignment of the semiconductor wafers in loaded height in association with the deformation of the thin plate supporting container 1 by measuring the positions of the semiconductor wafers directly. The position sensor 33 may be of various types of sensors. Since the semiconductor wafer reflects light on a surface thereof, a sensor using a laser beam like the aforementioned thickness sensor 32 may be employed. In this case, in addition to the light beams reflected from the lower surface and the upper surface of the side wall portion 2A, a third reflecting light beam is detected, and the height of the isosceles triangle calculated thereby corresponds to the position of the semiconductor wafer stored in the thin plate supporting container 1. The misalignment of the semiconductor wafer is measured by comparing the height with the preset value. It is also applicable to measure the time which is required for the laser beam to reflect on the semiconductor wafer and come back and calculate the position of the semiconductor wafers. This arithmetic processing is carried out by the control unit 31.

The retracting force detection sensor 34 is a sensor for detecting the force to retract the hook member 24 which is engaged with the retaining member 15 of the thin plate supporting container 1. The retracting force detection sensor 34 includes a piezoelectric element (not shown) built in a surface of the hook member 24 which abuts against the front retaining strip 15A or in the supporting shaft 28. The piezoelectric element measures a compression force when it is provided in the surface which abuts against the front retaining strip 15A, while it measures an expanding force when it is provided in the supporting shaft 28. The piezoelectric element converts the change of the pressure into electric signals, and outputs the same to the control unit 31.

The respective sensors 32, 33, 34 described above are provided on the upper surface of the loading port 20 in a state of being faced to the thin plate supporting container 1.

The rotation drive unit 35 is a circuit for driving the rotating mechanism of the supporting shaft driving mechanism 29. The rotation drive unit 35 drives the rotating mechanism of the supporting shaft driving mechanism 29 to rotate the supporting shaft 28 in the state of allowing the vertical movement thereof. Accordingly, when the thin plate supporting container 1 is placed on the loading port 20 or carried out therefrom, the hook member 24 is rotated and kept in the stand-by state so as not to be an obstacle such as to come into contact with the retaining member 15. When the thin plate supporting container 1 is placed on the loading port 20, the rotation drive unit 35 is activated to rotate the hook member 24 to engage the hook member 24 with the front retaining strip 15A of the retaining member 15.

The vertical movement drive unit 36 is a circuit for driving the elevating mechanism of the supporting shaft driving mechanism 29. The supporting shaft 28 is moved in the vertical direction by driving the elevating mechanism. Accordingly, the hook member 24, being engaged with the front retaining strip 15A of the retaining member 15 is retracted downward to fix the thin plate supporting container 1 on the loading port 20. Furthermore, the vertical movement drive unit 36 controls the elevating mechanism based on the detection values of the respective sensors 32, 33, 34 to vary the force to pull the hook member 24.

Figure 8:
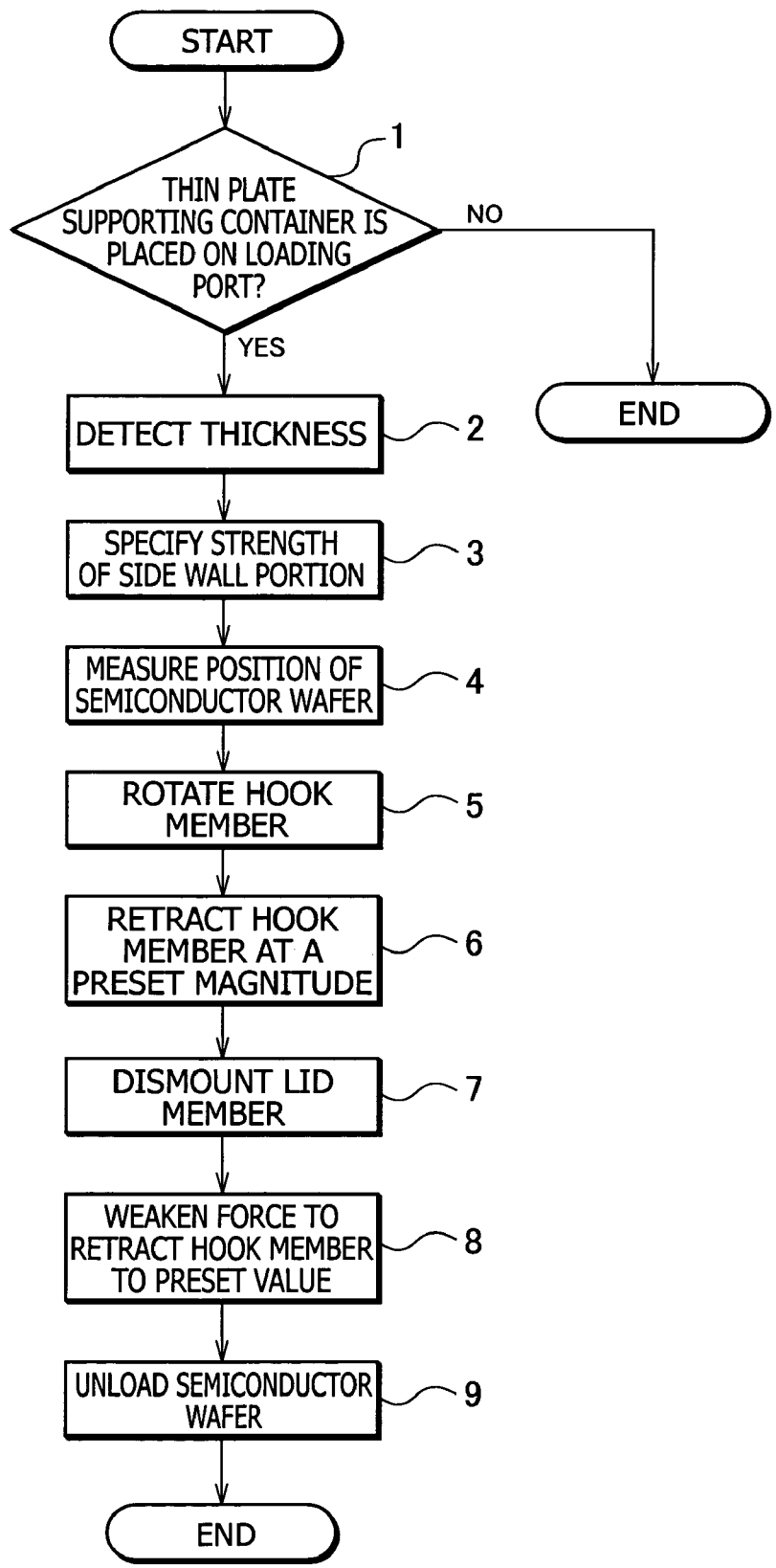
FIG. 8 is a flowchart showing a control function in a control unit.

The control unit 31 is a device mainly for controlling the operation of the hook member 24. The control unit 31 controls the operation of the hook member 24 based on the values detected by the respective sensors 32, 33, 34 to make the force to retract the hook member 24 strong in the step of mounting and dismounting the lid member 4 of the thin plate supporting container 1 and weak in the step of unloading and loading of the semiconductor wafer, and adjusts the magnitude of the force in each step according to the type of the thin plate supporting container 1. This adjustment is performed based on the values detected by the respective sensors 32, 33, and 34. The force to retract the hook member 24 in the step of mounting and dismounting the lid member 4 is set in advance in relation to the lid member attachment/detachment device. Therefore, adjustment is performed only when significant displacement between the lid member attachment/detachment device and the lid member 4 is detected by the position sensor 33. The force to retract the hook member 24 in the step of unloading and loading the semiconductor wafer is adjusted based on the values detected by the respective sensors. The control unit 31 is provided with a memory (not shown) in which the relation between the thickness of the side wall portion 2A and the strength is recorded. The relation between the thickness and the strength of the side wall portion 2A is different depending on the material of the side wall portion 2A, and hence the relation between the thickness and the strength of the side wall portion 2A is recorded for each material. The detected value from the thickness sensor 32 is compared with the relation between the thickness and the strength recorded for the memory, and the strength of the side wall portion 2A is specified. The control unit 31 has a function shown in a flowchart in FIG. 8 stored therein.

A Method of Control

The thin plate supporting container clamping device 21 configured as described above is operated as follows. The control of the control unit 31 is mainly described based on the flowchart shown in FIG. 8 below.

When the thin plate supporting container 1 is transported to the loading port 20 and the fitting groove 13 of the thin plate supporting container 1 is fitted to the fitting projection 22 on the loading port 20, the thin plate supporting container 1 is placed at a correct position on the loading port 20.

The control unit 31 observes whether or not the thin plate supporting container 1 is placed on the loading port 20 based on whether or not the light receiving elements of the respective sensors 32, 33 have activated (Step 1), and waits until the thin plate supporting container 1 is placed on the loading port 20. When the light receiving elements of the respective sensors 32, 33 activate, the control unit 31 determines that the thin plate supporting container 1 is placed on the loading port 20, and starts an operation of the thin plate supporting container clamping device 21.

The thickness sensor 32 detects the thickness of the side wall portion 2A (Step 2), and specifies the strength of the side wall portion 2A by referring to the relation between the thickness and the strength in the memory (Step 3). Subsequently, the position sensor 33 measures the positions of the semiconductor wafers, and stores the measured value in the memory as a reference height (Step 4).

Subsequently, the rotation drive unit 35 is controlled to rotate the hook member 24 from the stand-by state so as to be engaged with the front retaining strip 15A of the retaining member 15 (Step 5). Then, the hook member 24 is retracted at a preset magnitude (Step 6). The preset magnitude is adjusted while detecting with the retracting force detection sensor 34.

Subsequently, the lid member mounting/dismounting device is activated to dismount the lid member 4 (Step 7), and the force to retract the hook member 24 is weakened to the preset value (Step 8). At this time, the position sensor 33 measures the positions of the semiconductor wafers and compares with the aforementioned reference height. If the semiconductor wafers are misaligned in height, the force to retract the hook member 24 is fine-adjusted until the misalignment is eliminated. Accordingly, the semiconductor wafers are positioned accurately in height, and hence the fork portion of the semiconductor wafer unloading/loading device is prevented from coming into contact with the semiconductor wafer.

Subsequently, the semiconductor wafer unloading/loading device is activated to take the semiconductor wafer out to end the operation (Step 9).

In the case of storing the semiconductor wafers into the thin plate supporting container 1, the above described procedure is performed inversely. More specifically, the hook member 24 engaged with the front retaining strip 15A of the retaining member 15 of the thin plate supporting container 1 is supported by pulling with a weak force, which is the preset value described above, and at the timing when the semiconductor wafers are completely stored by the unloading/loading device, the hook member 24 is pulled with a strong force, which is the preset value described above, to mount the lid member 4. Then, the hook member 24 is released and rotated to restore the stand-by state. Thereafter, the thin plate supporting container 1 is carried out by the transporting device.

As described above, since the force to retract the hook member 24 is strengthened when removing the lid member 4, the container body 2 can be prevented from being displaced on the loading port 20. On the other hand, since the force is weakened when loading and unloading the semiconductor wafers, the deformation of the container body 2 after having removed the rid member 4 can be prevented.

In other words, since the hook member 24 that engages the retaining portion (retaining member 15) of the thin plate supporting container 1 and supports the entire thin plate supporting container 1, the drive unit 25 that retracts the hook member 24 in a state in which the hook member 24 is supported so as to be capable of moving in the vertical direction and the hook member 24 is engaged with the retaining portion (retaining member 15) of the thin plate supporting container 1 to support the thin plate supporting container 1, and the control unit 31 for controlling the force to retract the hook member 24 by the drive unit 25 to be strong when mounting and dismounting the lid member 4 of the thin plate supporting container 1, and to be weak when unloading and loading the thin plates are provided so that the control unit 31 controls the force to retract the hook member 24 by the drive unit 25 to be strong when dismounting the lid member 4 of the thin plate supporting container 1 and to be weak when unloading and loading the thin plate thereafter, the displacement of the container body 2 when dismounting the lid member 4 from the container body 2 can be reliably prevented, and the deformation of the container body 2 after having removed the lid member 4 can be prevented.

Furthermore, since the fine adjustment is performed based on the detected values of the thickness sensor 32, the position sensor 33 and the retracting force detection sensor 34, the positional misalignment of the semiconductor wafers in height can be prevented accurately, whereby the fork portion of the unloading and loading device is prevented from coming in contact with the semiconductor wafers thereby scratching and damaging the same when unloading and loading the semiconductor wafers automatically.

In other words, the force to retract the hook member 24 is strengthened when dismounting the lid member 4 and weakened when unloading and loading the thin plates thereafter so as to prevent the displacement of the container body 2 when dismounting the lid member 4 and the deformation of the container body 2 after having removed the lid member 4. Therefore, misalignment of the thin plates stored therein in height is prevented, and hence the fork portion of the thin plate unloading and loading device is prevented from coming into contact with the thin plates thereby scratching or damaging the same when unloading and loading the thin plates automatically.

The thin plate supporting container clamping device 21 includes the thickness measuring device (thickness sensor 32) for measuring the thickness of the wall surface of the thin plate supporting container 1 on which the retaining portion (retaining member 15) is provided, and the control unit 31 adjusts the force to retract the hook member 24 based on the thickness of the wall surface measured by the thickness measuring device. Therefore, the deformation of the wall surface and the container body 2 due to the difference of the thickness of the wall surface can be restrained, and hence the misalignment of the positions of the thin plates stored therein in the height direction can be prevented. Accordingly, the fork portion of the thin plate unloading and loading device is prevented from coming into contact with the thin plate thereby scratching or damaging the same when unloading and loading the thin plates automatically.

The thin plate supporting container clamping device 21 includes the position measuring device (position sensor 33) for measuring the positions of the thin plates in the thin plate supporting container 1, and the control unit 31 adjusts the force to retract the hook member 24 based on the position of the thin plate measured by the position measuring device. Therefore, since the control unit adjusts the force to retract the hook member 24 based on the positions of the thin plates measured by the position measuring device, the positional displacement of the thin plates stored therein in the height direction can be prevented. Accordingly, when unloading and loading the thin plate automatically, the fork portion of the thin plate unloading and loading device is prevented from coming into contact with the thin plate thereby scratching or damaging the same.

Furthermore, since the thin plate supporting container clamping device 21 is provided with the retracting force detection device (retracting force detection sensor 34) for detecting the force to retract the hook member 24 being engaged with the retaining portion of the thin plate supporting container 1, and the control unit 31 adjusts the force to retract the hook member 24 based on the retracting force measured by the retracting force detection device, the misalignment of the thin plates stored therein in the height direction can be prevented. Accordingly, the fork portion of the thin plate unloading and loading device is prevented from coming into contact with the thin plates, thereby scratching and damaging the same when unloading and loading the thin plate automatically.

Modification (1) In the above-described embodiment, the thin plate supporting container for storing the semiconductor wafer is described as an example of the thin plate supporting container. However, the invention is not limited thereto, and may be applied to all types of thin plate supporting container for storing the thin plates such as a memory disk or a liquid crystal glass substrate.

In this case as well, the effects and advantages as in the above-described embodiment will be achieved.

(2) In the above-described embodiment, the force to pull the hook member 24 is adjusted automatically with the sensor. However, it is also possible to set the two steps of values in advance (a larger value for mounting and dismounting the lid member, and the lower value for unloading and loading the semiconductor wafer) and select one of those.

In this case as well, the effects and advantages as in the above-described embodiment will be achieved.

(3) In the above described embodiment, the thickness sensor 32 and the position sensor 33 are provided. However, it is also possible to adapt to be controlled with either one of sensors.

What is claimed is:

1. A thin plate supporting container clamping device for fixing a thin plate supporting container when the thin plate supporting container in which thin plates are stored therein for transportation is placed on a loading port at a destination thereof for unloading and loading the thin plates automatically, comprising:
   a hook member for engaging with a retaining portion of the thin plate supporting container and supporting the entire thin plate supporting container;
   a drive unit which supports the hook member so as to be movable in the vertical direction and supports the thin plate supporting container by retracting the hook member while engaging the retaining portion of the thin plate supporting container;
   a position measuring sensor for measuring a vertical position of the thin plates in the thin plate supporting container; and
   a control means for controlling the drive unit to exert a retraction force on the hook member to retract the hook member with a first force while the hook member is engaged with the retaining portion, when mounting and dismounting a lid member of the thin plate supporting container, and for reducing the retraction force to a second force, while the hook member is engaged with the retaining portion, when unloading and loading the thin plates, wherein the second force is less than the first force, wherein the control unit adjusts the second force to retract the hook member in accordance with a value for the measured vertical position of the thin plates received from the position measuring sensor.

2. The thin plate supporting container clamping device according to claim 1, further comprising:
   a retracting force detection sensor for detecting a force for retracting the hook member engaged with the retaining portion of the thin plate supporting container, wherein the control unit adjusts the force to retract the hook member in accordance with a value for the retracting force received from the retracting force detection sensor.

3. The thin plate supporting container clamping device according to claim 1, further comprising:
   a support shaft defining a vertical axis, having an upper end fixed to the hook and a lower end connected to the drive unit;
   wherein the drive unit drives the support axially and rotatably about the axis; and
   wherein the control unit comprises:
   a vertical movement drive circuit for controlling the vertical movement of the support shaft; and
   a rotation drive circuit for controlling rotation of the support shaft.

4. The thin plate supporting container clamping device according to claim 1, further comprising:
   a support shaft defining a vertical axis, having an upper end fixed to the hook and a lower end connected to the drive unit;
   wherein the drive unit drives the support axially and rotatably about the axis; and
   wherein the control unit comprises:
   a vertical movement drive circuit for controlling the vertical movement of the support shaft; and
   a rotation drive circuit for controlling rotation of the support shaft.

5. The thin plate supporting container clamping device according to claim 2, further comprising:
   a support shaft defining a vertical axis, having an upper end fixed to the hook and a lower end connected to the drive unit;
   wherein the drive unit drives the support axially and rotatably about the axis; and
   wherein the control unit comprises:
   a vertical movement drive circuit for controlling the vertical movement of the support shaft; and
   a rotation drive circuit for controlling rotation of the support shaft.

6. The thin plate supporting container device according to claim 1 further comprising:
   a support shaft defining a vertical axis, having an upper end fixed to the hook member and a lower end connected to the drive unit; and
   wherein the drive unit drives the support shaft vertically along the vertical axis and rotatably about the vertical axis.

7. The thin plate supporting container device according to claim 1 further comprising:
   a support shaft defining a vertical axis, having an upper end fixed to the hook member and a lower end connected to the drive unit; and
   wherein the drive unit drives the support shaft vertically along the vertical axis and rotatably about the vertical axis.

8. The thin plate supporting container device according to claim 2 further comprising:
   a support shaft defining a vertical axis, having an upper end fixed to the hook member and a lower end connected to the drive unit; and
   wherein the drive unit drives the support shaft vertically along the vertical axis and rotatably about the vertical axis.

* * * * *

UNITED STATES PATENT AND TRADEMARK OFFICE
CERTIFICATE OF CORRECTION

PATENT NO.        : 7,665,787 B2                                      Page 1 of 1
APPLICATION NO.   : 11/245159
DATED             : February 23, 2010
INVENTOR(S)       : Tadahiro Obayashi It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1124 days.

Signed and Sealed this

Fourth Day of January, 2011

David J. Kappos
*Director of the United States Patent and Trademark Office*